(12) United States Patent
Hwang et al.

(10) Patent No.: US 6,278,919 B1
(45) Date of Patent: Aug. 21, 2001

(54) APPARATUS FOR DIAGNOSING AND INDICATING OPERATIONAL FAILURE IN AUTOMOBILES

(75) Inventors: Chang-sun Hwang, Goyang; Do-hyoung Kim, Seoul, both of (KR)

(73) Assignee: Yuiltech Co., Ltd. (KR)

( * ) Notice: Subject to any disclaimer, the term of this patent is extended or adjusted under 35 U.S.C. 154(b) by 0 days.

(21) Appl. No.: 09/468,409

(22) Filed: Dec. 20, 1999

(30) Foreign Application Priority Data

Dec. 24, 1998 (KR) .................................................. 98-26978
Jun. 11, 1999 (KR) .................................................. 99-21713
Jun. 25, 1999 (KR) .................................................. 99-24312
Jul. 6, 1999 (KR) .................................................. 99-13153

(51) Int. Cl.[7] ............................. G01H 17/00; G06F 19/00
(52) U.S. Cl. ................. 701/29; 701/30; 701/36; 701/1; 307/9.1; 307/10.6; 340/425.5
(58) Field of Search ....................... 701/29, 1, 36, 701/34, 30; 307/9.1, 10.6, 425.5, 428, 500, 445

(56) References Cited

U.S. PATENT DOCUMENTS 5,529,142 * 6/1996 Burke, III ............................ 180/287
6,114,952 * 9/2000 Francesangeli et al. ............. 340/453
6,144,110 * 9/2000 Francesangeli et al. ............. 340/453

* cited by examiner

*Primary Examiner*—William A. Cuchlinski, Jr.
*Assistant Examiner*—Olga Hernandez
(74) *Attorney, Agent, or Firm*—Burns, Doane, Swecker & Mathis

(57) ABSTRACT

An apparatus for diagnosing and indicating operational failure in automobiles includes a diagnostic circuit for receiving signals input through wiring at both ends of each fuse and wiring of a relay in a fuse box or junction box installed in an automobile and diagnosing operation failure by detecting a change in the logic value of the input signal, and an output device for receiving the result of diagnosis from the diagnostic circuit and outputting signals indicating the location of a defective fuse or relay. Thus, a driver having little knowledge on car maintenance can easily take actions for repair or an emergency measure of automobiles according to the result of diagnosis of operational failure of the automobile informed in an audio-visual manner. Also, automobile repair experts or shops can save time needed for diagnosing and performing accurate repair using the apparatus for diagnosing and indicating operational failure in automobiles according to the present invention.

16 Claims, 19 Drawing Sheets

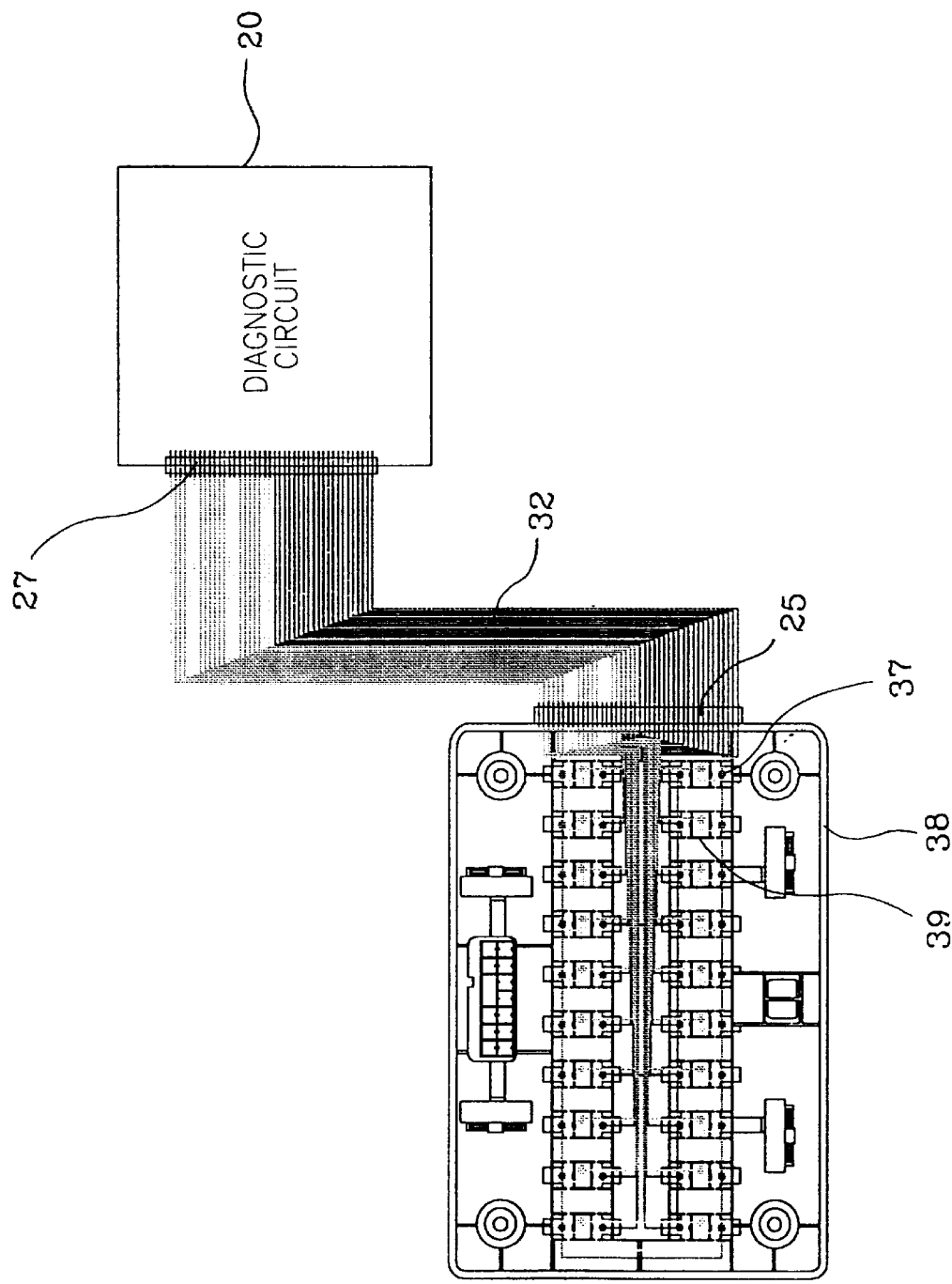

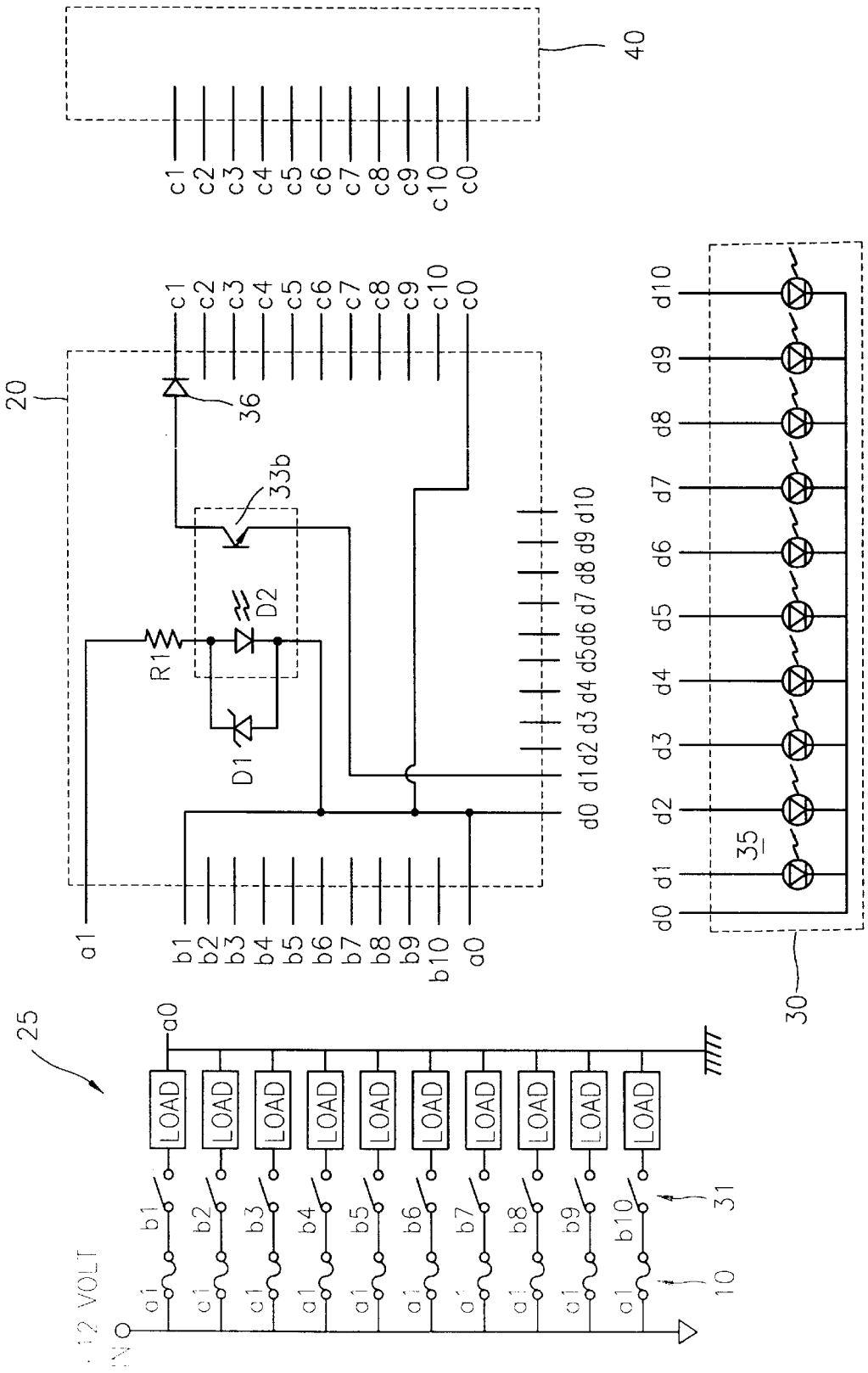

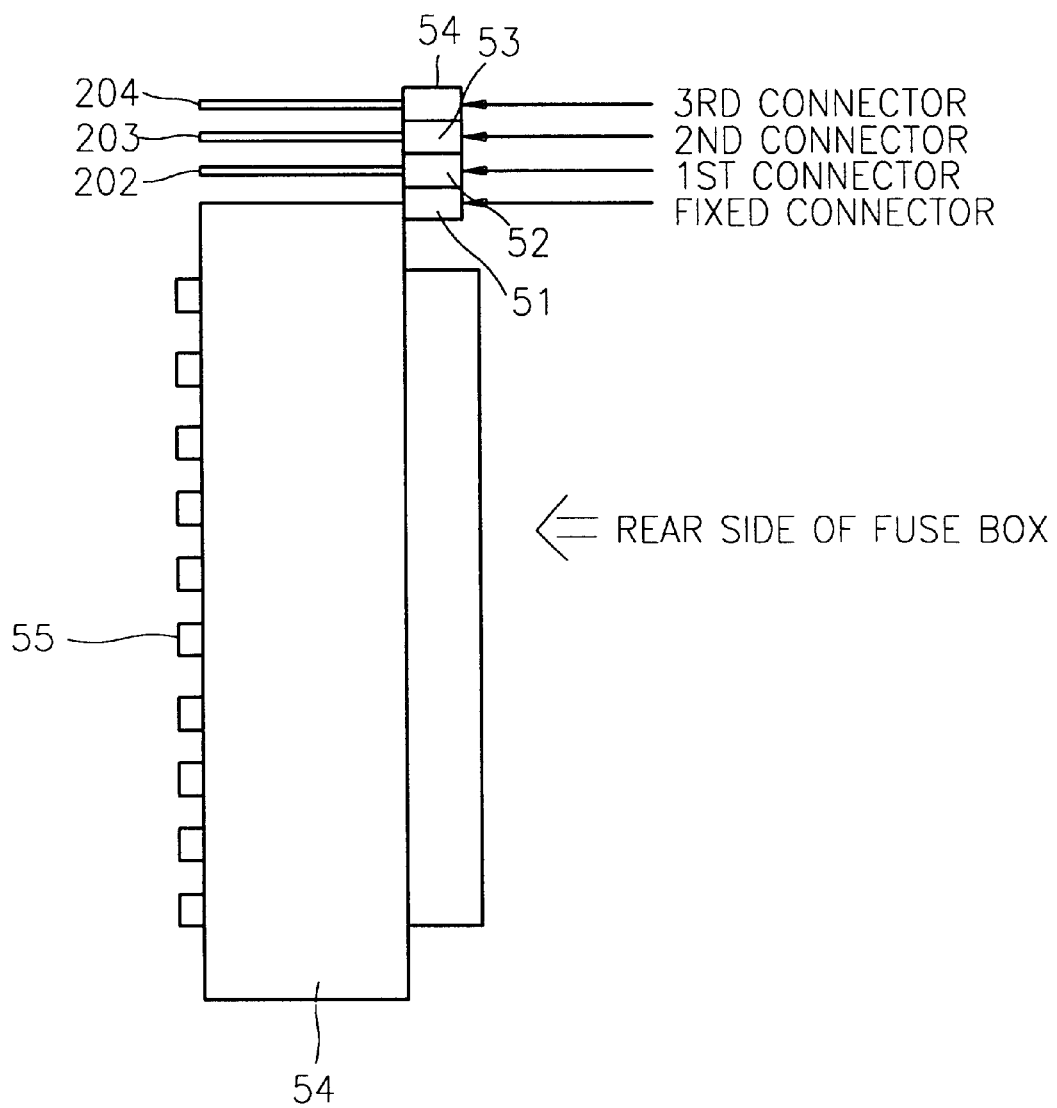

APPARATUS FOR DIAGNOSING AND INDICATING OPERATIONAL FAILURE IN AUTOMOBILES

Priority is claimed to Korean Utility Model Application Nos. 98-26978 and 99-13153 filed in Korea on Dec. 24, 1998 and Jul. 6, 1999, and on Korean Patent Application Nos. 99-21713 and 99-24312 filed in Korea on Jun. 11, and Jun. 25, 1999, all herein incorporated by reference.

BACKGROUND OF THE INVENTION

1. Field of the Invention

The present invention relates to an apparatus for diagnosing and indicating operational failure in automobiles, and more particularly, to an apparatus for diagnosing and indicating operational failure in automobiles which diagnoses operational failure of electric parts and circuits in automobiles, analyzes the result of the diagnosis and accurately informs a driver of the location where the operational failure occurred.

2. Description of the Related Art

When an abnormal situation occurs during operation of an automobile, that is, when a car malfunctions, safe driving can be seriously jeopardized. Most drivers have little knowledge on vehicle maintenance and are not capable of appropriately coping with such an abnormal situation. For example, when a sudden operational failure or functional deterioration occurs during operation of an automobile, usually most drivers are confused and safe driving is jeopardized. Further, they tend to forget even to think about directly and methodically finding the functional failure and repairing it. Even to experienced driver, it may take a great deal of time to directly find and repair a functional failure.

Basic car maintenance that can be directly handled by a driver are listed in detail in a car maintenance manual. Nevertheless, when an automobile malfunctions while a driver is driving, it is not easy to refer to the manual and find the problem.

In the case of mechanical malfunction, even a driver having car maintenance knowledge may not easily find the cause of the problem. If he/she succeeds in finding the cause of the problem, it is not easy to fix the problem when spare parts and tools to remedy the cause of malfunction are not provided.

Also, in the case of electrical malfunction, even when a driver having considerable knowledge of car maintenance can easily cope with a problem by checking fuses or relays in the automobile, most typical drivers are not able to handle the problem as they have little knowledge thereof. In particular, when a fuse in a fuse box of an automobile is burnt out, most drivers, if he/she succeeds in finding the fuse box, have difficulties in finding out which one of many various colored fuses is not working.

A fuse is generally used to protect electrical devices or electric circuits from being damaged due to an overload. In a complex apparatus such as common automobiles or industrial equipment where many fuses and wiring are needed, an additional fuse box is provided to integrally manage the fuses and wiring. In the case of an automobile, color fuses are used to indicate use of each fuse in the fuse box and a semitransparent fuse is used to easily indicate broken fuses. For general drivers who are not aware of such information, it is very difficult to check the disconnection of a fuse by pulling every fuse out of a fuse box. Also, as the space in the fuse box is very small and since it is usually dark around the fuse box, even replacement of a fuse in the fuse box is not an easy task.

Furthermore, for a sealed part such as a relay used for an automobile, it is nearly impossible for drivers to find a defective relay and pull it out. When an automobile is driven with such a defective fuse or a relay, a part of or all parts of the automobile such as the dash board, various lamps, the windshield wiper, the air conditioner, the audio component, the lighter, the defroster, etc., do not work properly, causing inconvenience during driving and even accidents.

SUMMARY OF THE INVENTION

To solve the above problems, it is an objective of the present invention to provide an apparatus for diagnosing and indicating operational failure in automobiles by which electric failure in an automobile is diagnosed and indicated.

It is another objective of the present invention to provide an apparatus for diagnosing and indicating operational failure in automobiles which is easily connected to an appropriate position of a built-in or external type fuse box in existing automobiles.

It is yet another objective of the present invention to provide an apparatus for diagnosing and indicating operational failure in automobiles which enables an audio-visual indication and indication of the position where failure occurred.

It is still another objective of the present invention to provide an apparatus for diagnosing and indicating operational failure in automobiles by which a driver can check, at any time, through a simple manipulation whether there is any electric malfunctioning parts.

Accordingly, to achieve the above objective, there is provided an apparatus for diagnosing and indicating operational failure in automobiles, which comprises a diagnostic circuit for receiving signals input through wiring at both ends of each fuse and wiring of a relay in a fuse box or junction box installed in an automobile and diagnosing operation failure by detecting a change in the logic value of the input signal, and an output device for receiving the result of diagnosis from the diagnostic circuit and outputting signals indicating the location of a defective fuse or relay.

It is preferred in the present invention that the diagnostic circuit comprises a logic element for checking a change in electric potential at both ends of the fuse or relay and outputting a logic value and a gating element gated according to the logic value.

Also, it is preferred in the present invention that the logic element is a comparator for checking changes of voltage at both ends of the fuse or relay, including an exclusive NOR (EX-NOR) gate or a transistor element.

Also, it is preferred in the present invention that an additional independent power circuit is connected to both ends of the fuse of relay to apply a voltage to the fuse.

Also, it is preferred in the present invention that, when the diagnostic circuit is a built-in type, the diagnostic circuit is arranged in space allowed on a single printed circuit board and connected to an external output device through a cable wire.

Also, it is preferred in the present invention that, when the diagnostic circuit is an external type, the diagnostic circuit is arranged on a single printed circuit board to be installed in an external box and connected to the fuse box through a cable wire and to an internal or the external output device.

Also, it is preferred in the present invention that the diagnostic circuit and the output device are formed on a single printed circuit board or different printed circuit boards.

Also, it is preferred in the present invention that, when the diagnostic circuit is an external type, the diagnostic circuit is arranged on a single printed circuit board, and a connector pin protruding from the board is formed of a cartridge type to be inserted in a contact point hole of each fuse in the fuse box.

Also, it is preferred in the present invention that the output device comprises a lamp circuit and lamp for indicating the location of a defective fuse or relay according to the result of diagnosis by the diagnostic circuit.

Also, it is preferred in the present invention that the output device comprises a voice guide module and a speaker for indicating by voice the location of a defective fuse or relay according to the result of diagnosis by the diagnostic circuit.

Also, it is preferred in the present invention that the output device comprises a text generating portion and a display for indicating the location of a defective fuse or relay according to the result of diagnosis by the diagnostic circuit.

Also, it is preferred in the present invention that the output device comprises a lamp circuit and lamp for indicating the location of a defective fuse or relay according to the result of diagnosis by the diagnostic circuit, a voice guide module and a speaker for indicating by voice the location of a defective fuse or relay according to the result of diagnosis by the diagnostic circuit, and a text generating portion and a display for indicating the location of a defective fuse or relay according to the result of diagnosis by the diagnostic circuit.

Also, it is preferred in the present invention that the output device comprises a lamp circuit and lamp for indicating the location of a defective fuse or relay according to the result of diagnosis by the diagnostic circuit and a text generating portion and a display for indicating the location of a defective fuse or relay according to the result of diagnosis by the diagnostic circuit.

Also, it is preferred in the present invention that a fuse connector connected to the fuse is of a hermaphroditic body so that a female connector portion is connected to the fuse and a male connector portion is connected to the diagnostic circuit and also to a connector in a fuse insertion hole of the fuse box.

Also, it is preferred in the present invention that a relay connector connected to the relay is of a hermaphroditic body so that a female connector portion is connected to the relay and a male connector portion is connected to the diagnostic circuit and also to a connector in a relay insertion hole of the relay box.

BRIEF DESCRIPTION OF THE DRAWINGS

The above objective and advantages of the present invention will become more apparent by describing in detail a preferred embodiment thereof with reference to the attached drawings in which:

FIG. 3 is a view showing a state in which the diagnostic circuit of FIGS. 2A–2C is connected to wiring of a fuse box;

FIGS. 4A, 4B and 4C are diagrams showing structural parts of FIGS. 2A, 2B and 2C except for a text generating circuit and a display of the apparatus for diagnosing and indicating operational failure in automobiles of FIG. 1;

FIG. 5 is a view showing an example in which an external cartridge type apparatus for diagnosing and indicating operational failure in automobiles according to the present invention is applied to a fuse box for automobiles;

DETAILED DESCRIPTION OF THE INVENTION

Figure 1:
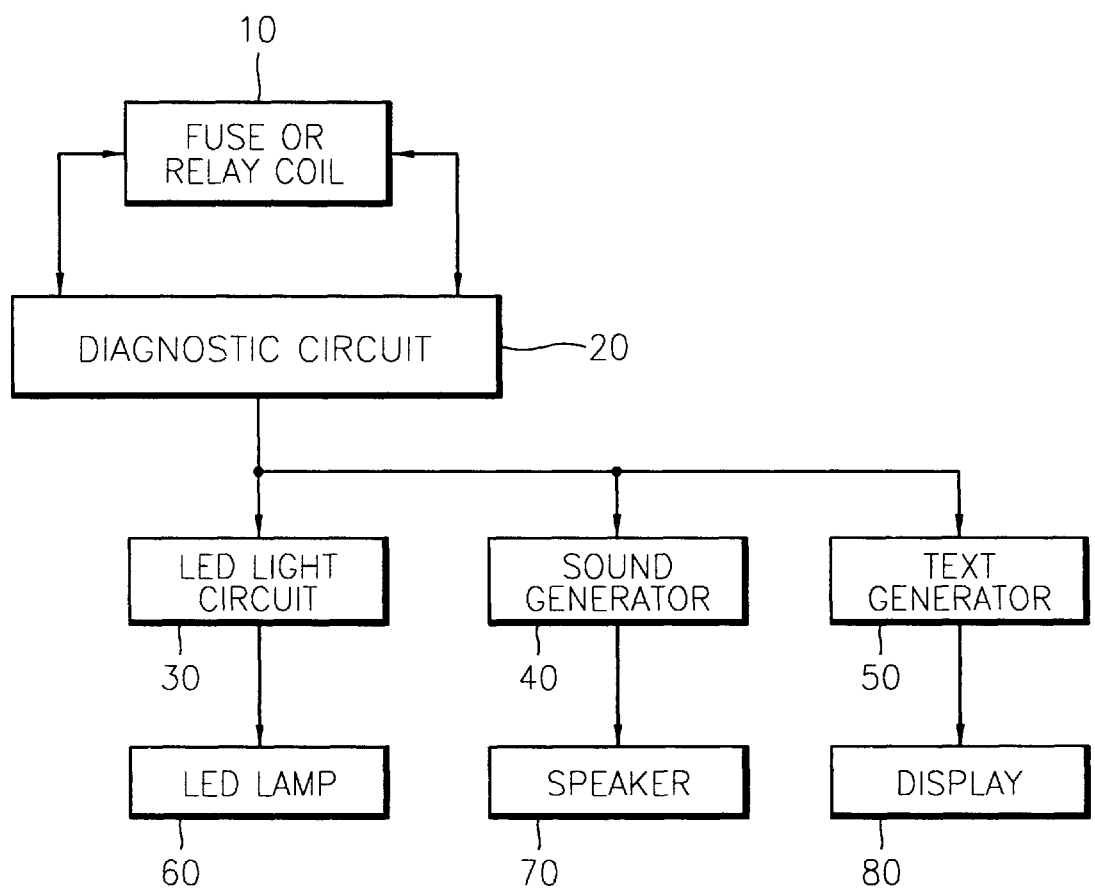
FIG. 1 is a block diagram showing an apparatus for diagnosing and indicating operational failure in automobiles according to a preferred embodiment of the present invention.

In the description below, elements performing the same functions are designated with the same reference numerals.

When an overload occurs due to malfunction of an electrical device in an automobile, current and voltages change and excess current and voltage may flow to the electrical device through electric wiring. Thus, resistance heat is generated at the electric parts and wiring so that they can be damaged. To protect the electric parts and wiring from an overheated state, a fuse is used to protect the electric parts and wiring from being damaged due to the overheated state so that the fuse is disconnected before the electric parts and wiring are damaged. Also, various kinds of relays are used for various motors or control circuits used for automobiles. Whether electric devices in automobiles function normally can be checked by checking the state of these relays like the fuse. Thus, in the present invention, whether the electric devices used for automobiles function normally is diagnosed and indicated by detecting changes in voltage at both ends of the fuse or relay.

FIG. 1 shows an apparatus for diagnosing and indicating operational failure in automobiles according to a preferred embodiment of the present invention. As shown in the drawing, according to the basic principle of operation, the apparatus for diagnosing and indicating operational failure in automobiles of the present invention includes a diagnostic circuit 20 for diagnosing operational failure by detecting changes in voltage at both ends of a fuse or relay coil 10, and an output device, including an LED lighting circuit 30, a sound generating portion 40 and a text generating circuit 50, for receiving the result of the diagnosis from the diagnostic circuit 20 and outputting a signal indicating malfunction in an audio-visual manner. The LED lighting circuit 30 connected to an LED lamp 60 indicates whether the fuse or relay coil 10 is defective in an audio-visual manner. The sound generating portion 40 includes a memory and outputs programmed voice for guidance through a speaker 70. Also, the sound generating portion 40 includes a buzzer circuit or a melody circuit to perform an alarm function. The text generating circuit 50 generates text indicating the location of malfunction and outputs the generated texts through a display 80. In FIG. 1, although all of the LED lighting circuit 30, the sound generating portion 40 and the text generating circuit 50 are included as the output device, one or two of them can be included in the apparatus for diagnosing and indicating operational failure in automobiles according to the present invention. Here, although not shown in FIG. 1, to avoid a situation in which abrupt warning sound or voice for guidance may surprise a driver, for safe driving, by installing a switch (not shown) in front of the sound generating portion 40, the sound generating portion 40 is operated when malfunction occurs and the driver operates the switch. Thus, the driver can operate the switch to hear the voice or sound when electrical malfunction in an automobile occurs.

Figure 2A:
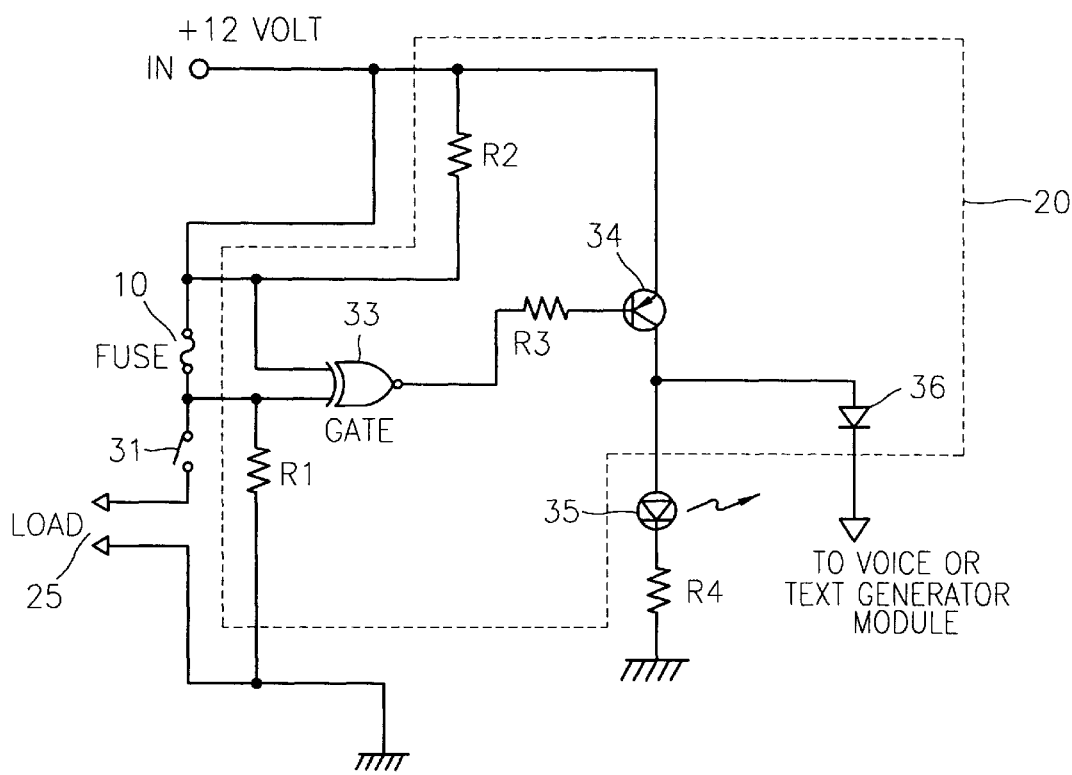
FIG. 2A is a circuit diagram showing an example of the diagnostic circuit shown in FIG. 1 using a logic element and a gating element.

FIG. 2A is a circuit diagram of the diagnostic circuit 20 shown in FIG. 1. As shown in FIG. 2A, the diagnostic circuit 20 includes a logic element 33 for checking voltages at both ends of the fuse or relay 10 to protect a load 25 when a power switch 31 is turned on and outputting a logic value, and a gating element 34 gated according to the logic value. The present preferred embodiment of the logic element 33 is an exclusive NOR gate and the gating element 34 is a transistor. When the fuse or relay coil is disconnected, the output of the logic element is "1" and the gating element 34 is gated so that the LED lamp 35 is driven and a diode 36 for transmitting signals to the sound generating portion 40 or the text generating portion 50 is turned on. Although a diagnostic circuit with respect to a fuse is shown in FIG. 2A, as many diagnostic circuits as the number of fuses or relays are configured. In FIG. 2A, R1–R4 denote resistors.

Figure 2B:
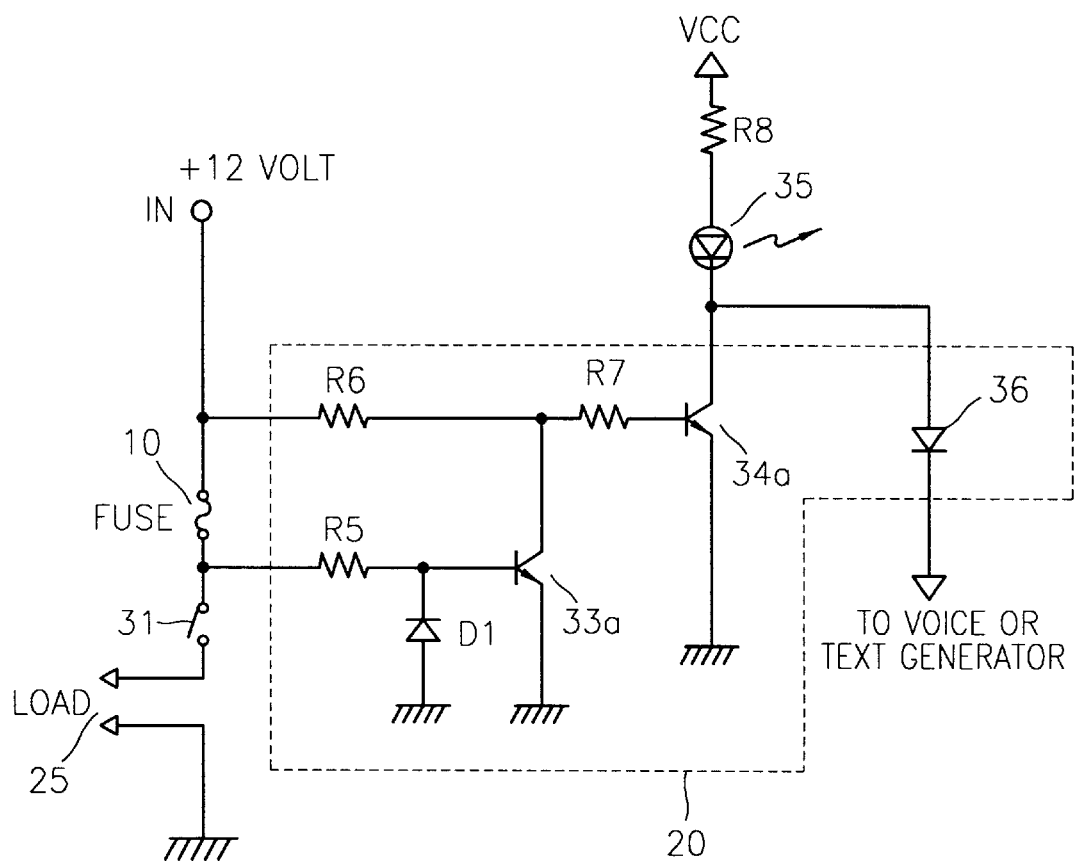
FIG. 2B is a circuit diagram showing another example of the diagnostic circuit shown in FIG. 1 using transistors instead of the logic element.

FIG. 2B is a circuit diagram showing another example of the diagnostic circuit 20 shown in FIG. 1. As shown in FIG. 2B, the diagnostic circuit 20 includes a logic element 33A for checking voltages at both ends of the fuse or relay 10 to protect a load 25 when a power switch 31 is turned on and comparing a logic value, and a gating element 34A gated according to the value of logic comparison. In the present preferred embodiment, the logic element 33A is an NPN transistor and the gating element 34A is an NPN transistor. When the fuse or relay coil is disconnected, the logic element 33A for comparison is turned off and the gating element 34A is gated so that the LED lamp 35 is driven and the diode 36 for transmitting signals to the sound generating portion 40 or the text generating portion 50 is turned on. Although a diagnostic circuit with respect to a fuse is shown in FIG. 2B, as many diagnostic circuits as the number of fuses or relays are configured. In FIG. 2B, R5–R8 and D1 and D2 denote resistors and diodes, respectively.

Figure 2C:
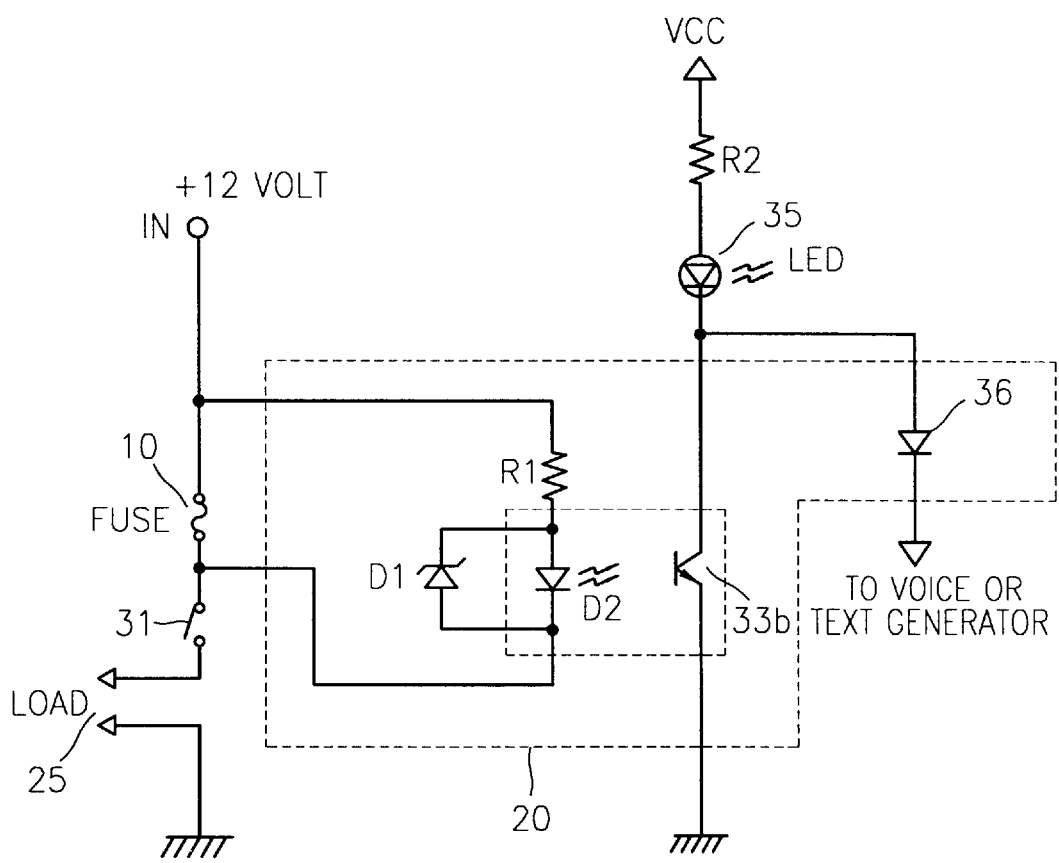
FIG. 2C is a circuit diagram showing yet another example of the diagnostic circuit shown in FIG. 1 using a photocoupler where a logic element and a gating element are integrally formed.

FIG. 2C is a circuit diagram showing yet another example of the diagnostic circuit 20 shown in FIG. 1. As shown in FIG. 2C, the diagnostic circuit 20 includes a device 33b where a device for detecting the difference in electric potential at both end portions of a fuse or the relay 10 to protect a load when the power switch 31 is turned on and a gating element is integrally formed. In the present preferred embodiment, the integral device 33B is a photocoupler device. When the fuse or relay coil 10 is disconnected, the integral device 33B detects the difference in electric potential at both end portions and performs gating to drive an LED lamp and electrically connect the diode 36 for transmitting signals to the sound generating portion 35 or the text generating circuit 50. Although a diagnostic circuit with respect to a single fuse is shown in FIG. 2C, as many diagnostic circuits as the number of fuses or relays are configured. In FIG. 2C, R1 and R2, and D1 and D2 denote resistors and difference diodes, respectively.

To apply the apparatus for diagnosing and indicating operational failure in automobiles according to the present invention shown in FIGS. 1, 2A, 2B and 2C to automobiles, connection thereof to the wiring of the existing fuse box or relay box should be made easy. Also, the apparatus should exhibit an easy assembly with other automobile parts so that no negative effects are given to the manufacturing process of the automobile. Whether automobile parts can be made into modules is closely related to productivity in automobile manufacture, the apparatus for diagnosing and indicating operational failure in automobiles according to the present invention is required to be modularized.

FIG. 3 shows a state in which the diagnostic circuit 20 of FIGS. 2A through 2C is connected to a fuse wiring circuit of a fuse box 38. As shown in the drawing, the diagnostic circuit 20 is configured as a single PCB module and connected to a fuse wiring circuit disposed in the lower portion of the existing fuse box 38 through a wire assembly 32. A fuse 37 is present in the fuse box 38 and an LED lamp 39 is under the fuse 37 so that the LED lamp 39 turns on to facilitate fuse replacement work. In FIG. 3, it can be seen that the apparatus for diagnosing and indicating operational failure in automobiles according to the present invention can be easily wire-assembled to the wiring circuit of the fuse box 38 through the diagnostic circuit 20. For example, a connector 25 is configured to be connected to the fuse wiring circuit in the lower portion of the fuse box 38 so as to be wire-assembled to a corresponding connector 27 of the diagnostic circuit 20. Here, a detailed description thereof is omitted as it is apparent to one skilled in the art.

Figure 4A:
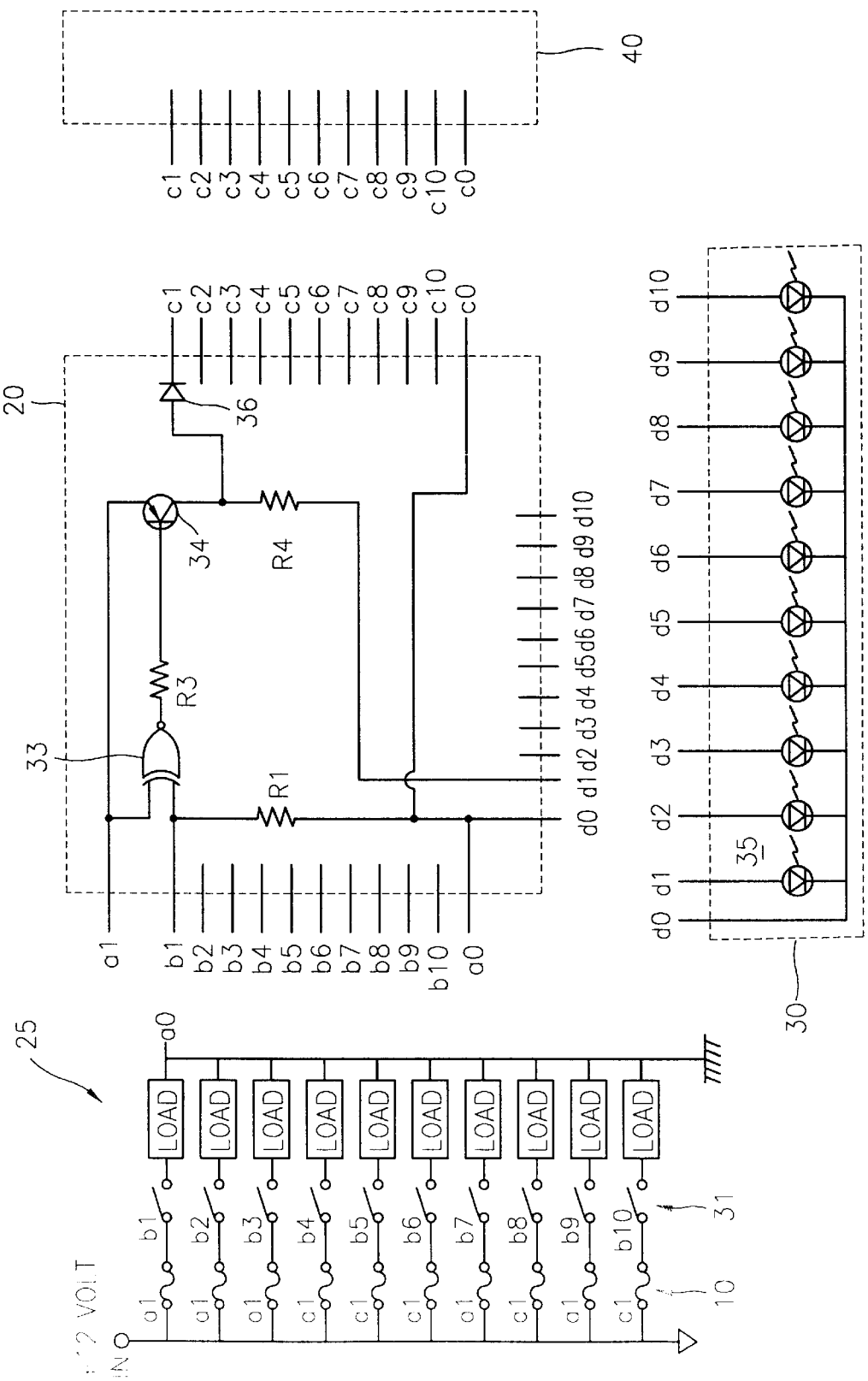
Figure 4B:
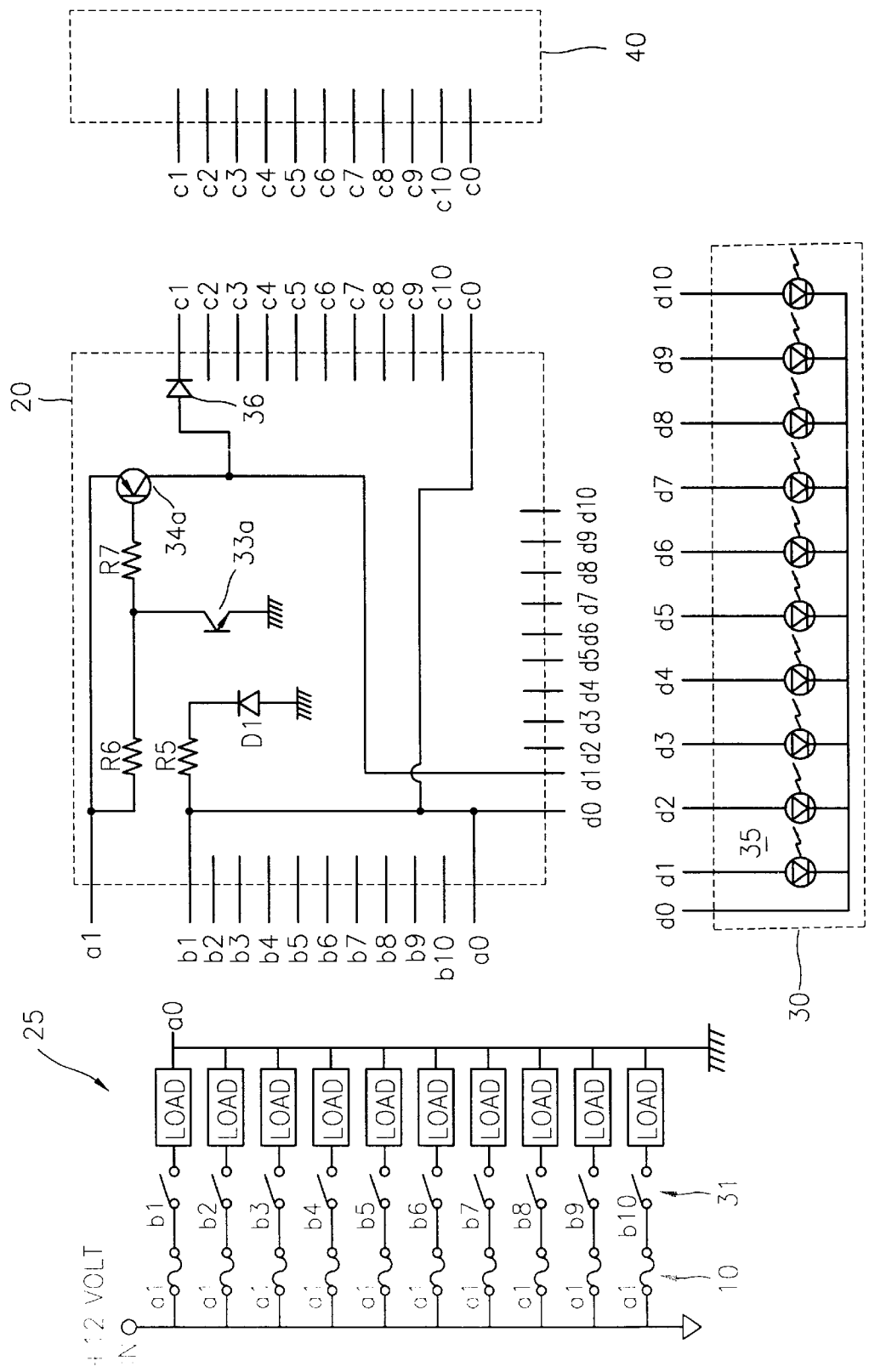

FIGS. 4A, 4B and 4C show structural elements of FIGS. 1, 2A, 2B and 2C excluding the text generating circuit and the display of the apparatus for diagnosing and indicating operational failure in automobiles according to the present invention of FIG. 1. The structural elements shown in FIG. 1, that is, the diagnostic circuit 20, the LED lighting circuit 30 and the sound generating portion 40, are modularized and integrally assembled on a PCB which will be described later. Reference numeral 10 in FIGS. 4A and 4B denotes a circuit for checking disconnection of a fuse or relay coil in which contact points a1 and a0 are wire-assembled in common to the diagnostic circuit 20. In this case, as many diagnostic circuits may be configured as the number of fuses or relays of an automobile and the diagnostic circuits may be installed on a single PCB or on several PCBs.

FIG. 5 shows an example of an external type apparatus for diagnosing and indicating operational failure in automobiles according to the present invention being applied to a fuse box of an automobile. In the drawing, a connector 52 externally installed at a fuse box 54 of an automobile is connected to a fuse wiring circuit (not shown) so that an extended cartridge type apparatus for diagnosing and indicating operational failure in automobiles 202 is easily connected to the connector 52. Here, the connector 52 is formed in multiple layers according to the number of fuses 55 to be checked. For example, the PCB 202 where the cartridge type apparatus for diagnosing and indicating operational failure in automobiles is installed including 12 fuses in a unit is connected to the connector 52. Thus, other PCBs 203 and 204 are connected to other connectors 53 and 54 to cover the number of fuses over 12 up to 24 for diagnosing and indicating operational failure in automobiles. Here, the connector 51 is a fixed circuit connected to the fuse wiring circuit and other connectors are sequentially connected to the fixed connector.

Figure 6:
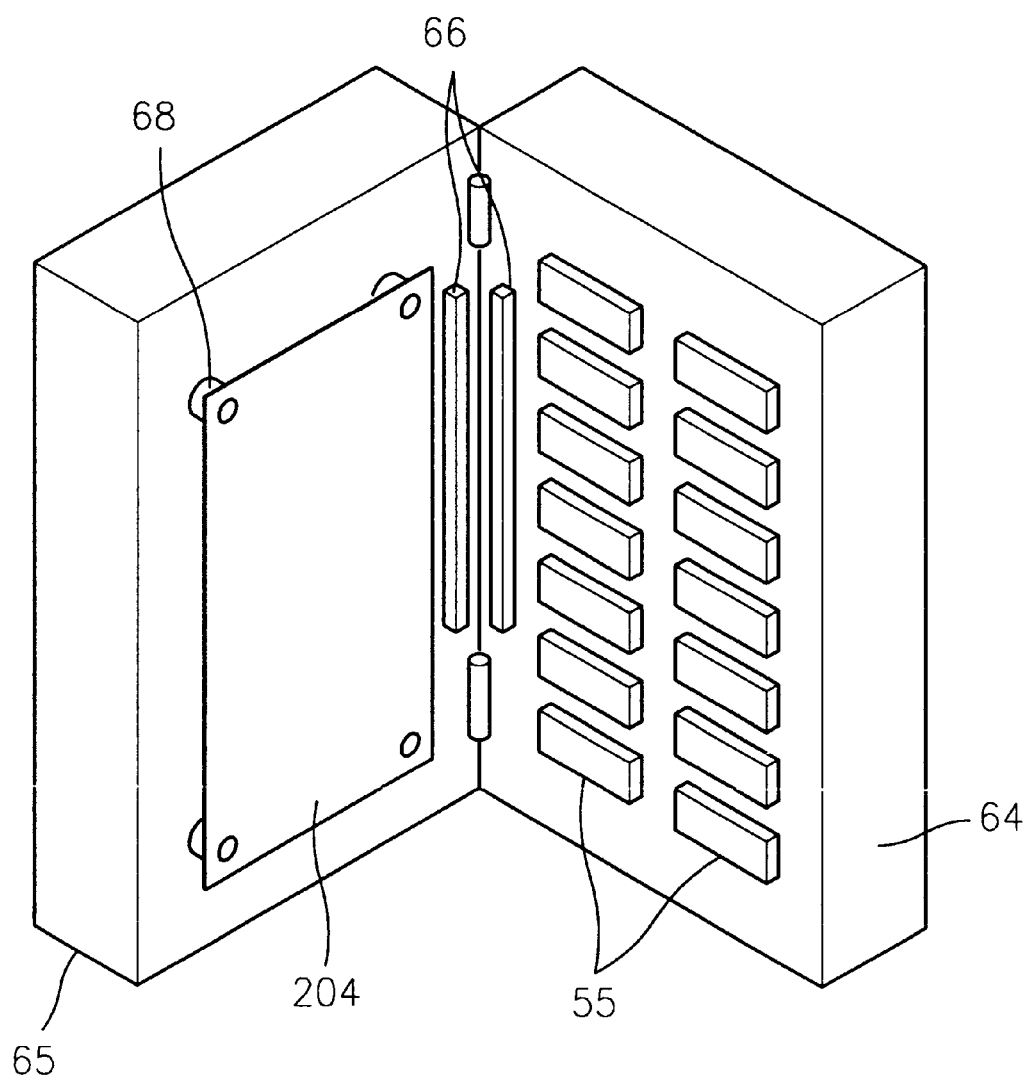
FIG. 6 is a view showing an example in which a built-in type apparatus for diagnosing and indicating operational failure in automobiles according to the present invention is applied to a fuse box for automobiles.

FIG. 6 shows another example in which the apparatus for diagnosing and indicating operational failure in automobiles of the present invention is applied to a fuse box of automobiles. In the drawing, a built-in type apparatus for diagnosing and indicating operational failure in automobiles 204 is installed on the inner surface of a case cover 65 of a fuse box 64. The type of apparatus for diagnosing and indicating operational failure in automobiles 204 is directly designed on a PCB and installed on the inner surface of the fuse box cover 65 by a PCB fixing device 68 so as to be connected to a wiring of the fuses 55 through a connector 66.

Figure 7A:
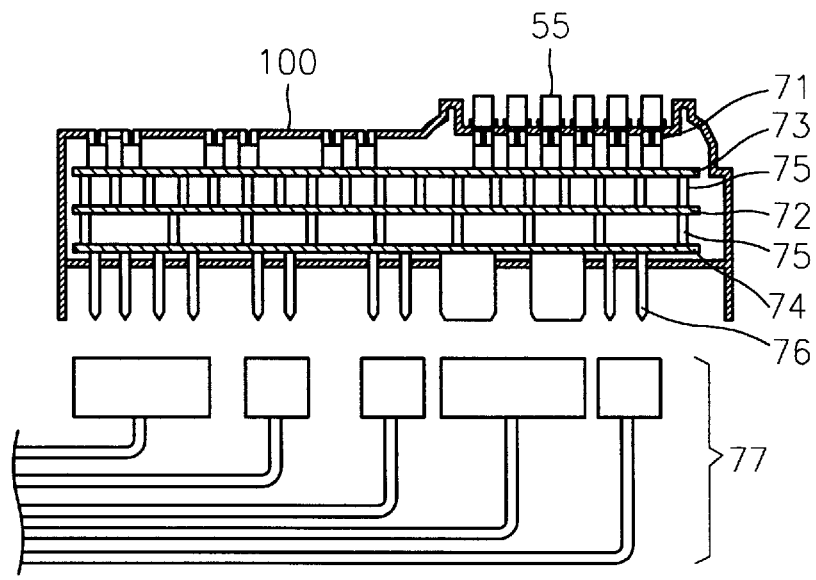
FIGS. 7A and 7B are views for explaining an apparatus for diagnosing and indicating operational failure in automobiles according to the present invention of which a diagnostic circuit is a built-in type.
Figure 7B:
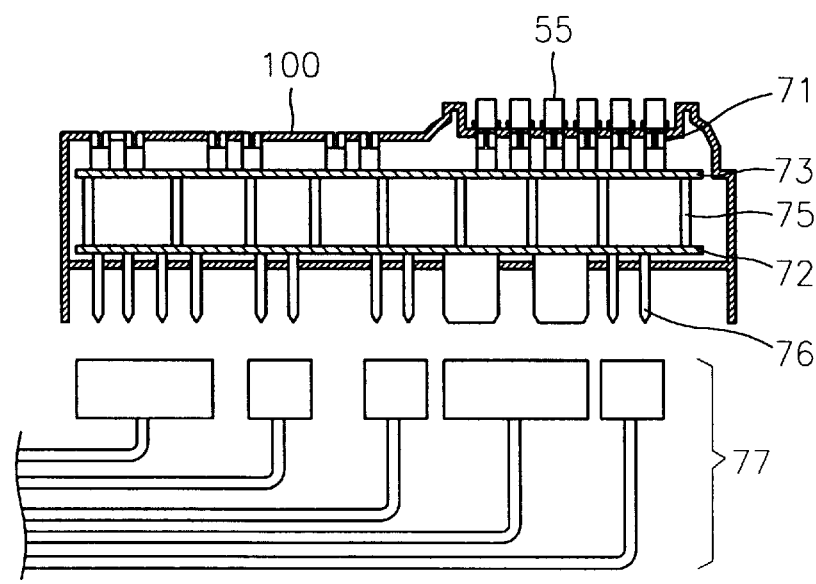

FIGS. 7A and 7B are views for explaining a case in which a circuit for diagnosing operational failure in automobiles of the present invention is a built-in type. Referring to FIG. 7A, when there is not sufficient space in an existing fuse box 100, a circuit for diagnosing operational failure in automobiles is configured on an additional PCB 72 and connected to existing PCBs 73 and 74 through a connection rod 75 to avoid wiring between the PCBs 73 and 74 through additional wires. Here, the fuses 55 are connected to the PCB 73 through a connector 71 and the PCB 74 disposed thereunder is coupled to a wiring harness 77 through a connector pin 76. Referring to FIG. 7B, when there is space in the PCBs 72 and 73 in the existing fuse box 100, the circuit for diagnosing operational failure in automobiles according to the present invention is installed on the existing PCB 72 or 73 and is connected to the other PCB 73 or 72 through the connection rod 75. Descriptions concerning other portions are omitted as they are identical to those described in FIG. 7A.

Figure 8:
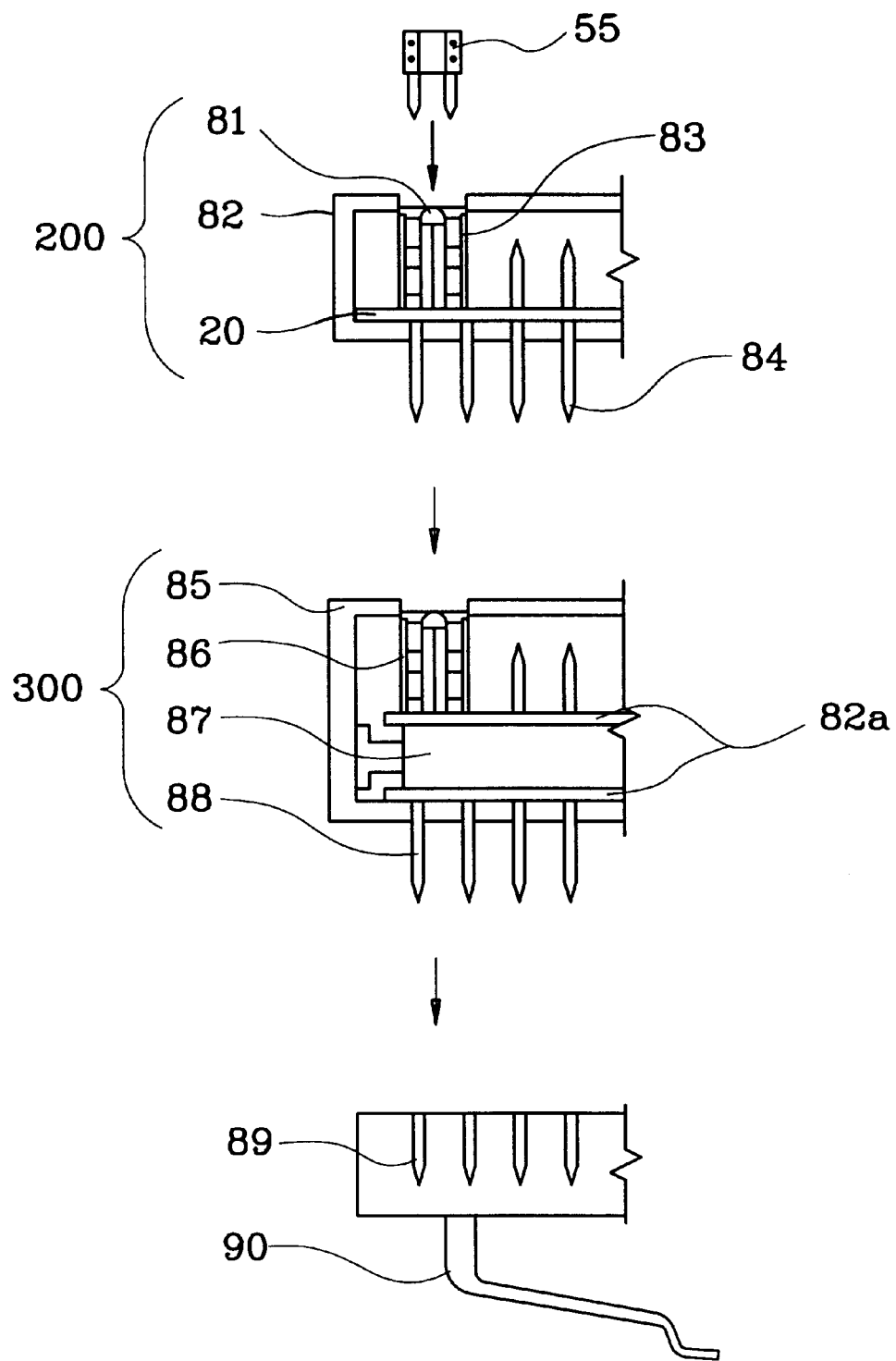
FIG. 8 is a sectional view for explaining the assembly of a diagnostic circuit of a cartridge-type external box type apparatus for diagnosing and indicating operational failure in automobiles according to the present invention applied to a fuse box for automobiles.

FIG. 8 is a sectional view for explaining the assembly of an external box type circuit for diagnosing operational failure in automobiles according to the present invention applied to a fuse box of automobiles. FIG. 8 is for explaining the order of assembling each part of the external cartridge type circuit for diagnosing operational failure in automobiles according to the present invention 200 to a fuse box 300 of an automobile, in which a diagnostic circuit of the apparatus for diagnosing and indicating operational failure in automobiles according to the present invention is installed on the PCB 20 indicated by a thick line. While the fuses 55 are inserted in a fuse box 300 in the conventional technology, the fuses 55 are inserted in a fuse connector 83 exposed to part of the external box type 82 diagnostic circuit for diagnosing operational failure in automobiles according to the present invention 200. An LED 81 is installed in the lower portion of the fuses 55 so that fuse wiring and LED wiring are connected to the diagnostic circuit 20 configured at the PCB. A connector pin 84 protruding from the other side of the external box 200 is connected to a connector 86 exposed from a case 85 of the fuse box 300. A case 82A where an existing fuse wiring circuit is installed is formed in the fuse box 300 and a connector pin 88 protrudes at a part of the case 82A. The connector pin 88 is connected to a harness consisting of a connector jack 89 and a wire 90 to indicate the result of diagnosis of the apparatus of the present invention through an output device. Here, the structures of the fuse connector and the connector connecting the cartridge type diagnostic circuit of the present invention and the fuse box will be described later.

Figure 9A:
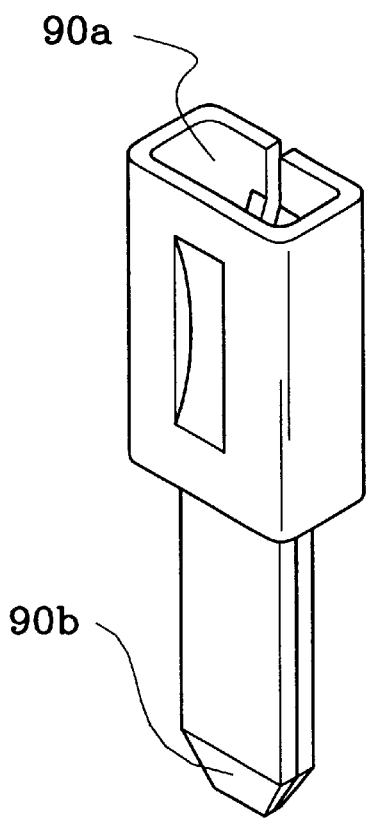
FIGS. 9A and 9B are a perspective view and a plan view showing the structures of a fuse connector applied to the present invention and a connector for connecting a fuse box and the cartridge type apparatus for diagnosing and indicating operational failure in automobiles according to the present invention.
Figure 9B:
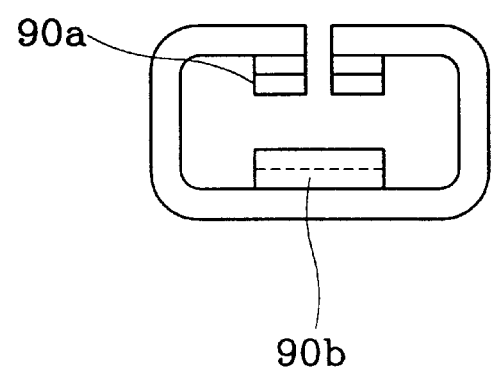
Figure 9C:
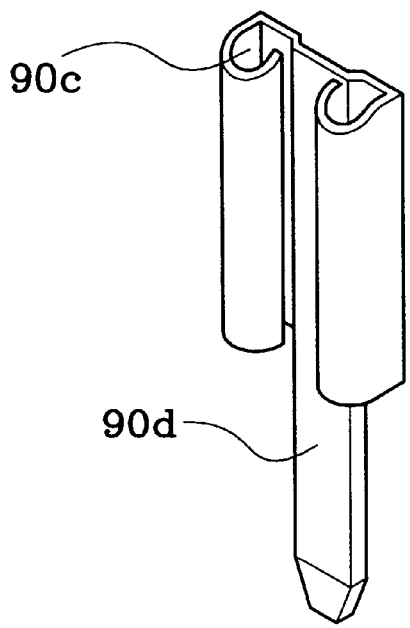
FIGS. 9C and 9D are a perspective view and a plan view showing the structures of a relay connector applied to the present invention and a connector for connecting a relay box and the cartridge type apparatus for diagnosing and indicating operational failure in automobiles according to the present invention.
Figure 9D:
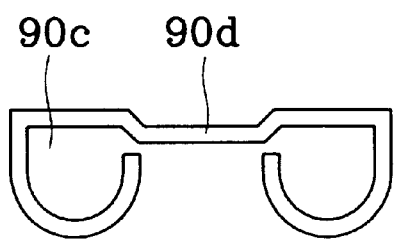

FIGS. 9A and 9B are a perspective view and a plan view showing the structures of the fuse connector applied to the present invention and the connector for connecting the fuse box and the cartridge type apparatus according to the present invention. FIGS. 9C and 9D are a perspective view and a plan view showing the structures of another fuse connector applied to the present invention and the connector for connecting the fuse box and the cartridge type apparatus according to the present invention.

As shown in FIGS. 9A and 9B, the connector of the present invention is a hermaphroditic body so that a female connector 90a is coupled to a fuse and a male connector 90b is connected to a PCB and the connector 86 of the fuse box. The shapes of the female and male connectors can be modified according to the shape of the fuse. Likewise, as shown in FIGS. 9C and 9D, the connector of the present invention is a hermaphroditic body so that a female connector 90c is connected to a relay and a male connector 90d is connected to a contact point of a PCB and the connector 86 of the fuse box. The shapes of the female and male connectors can be modified according to the shape of the relay. Here, two examples of the connector are shown according to the shape of the relay commonly used.

Figure 10:
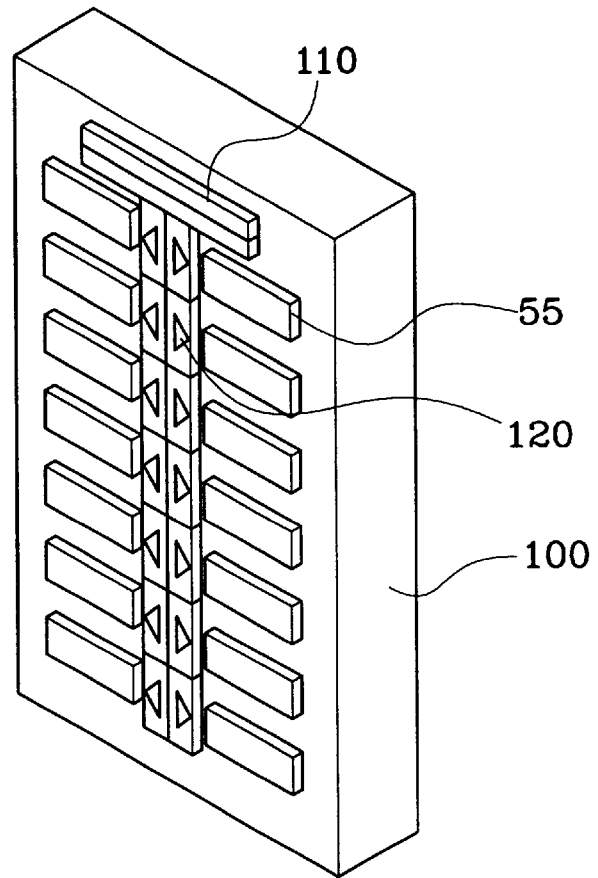
FIG. 10 is a perspective view showing LED lamps arranged in parallel between fuses of a fuse box.

FIG. 10 shows a state in which LED lamps are arranged parallel to each other between the fuses in the fuse box. In the drawing, when it is difficult to insert a lamp such as an LED because an assembly position hole of the fuses 55 in a fuse box 100 is narrow, an LED lamp 120 is installed between the fuses 55 to indicate malfunction of the fuse. Here, the connection between the LED lighting circuit and the LED and the fuse is connected by a connector 110.

Figure 11:
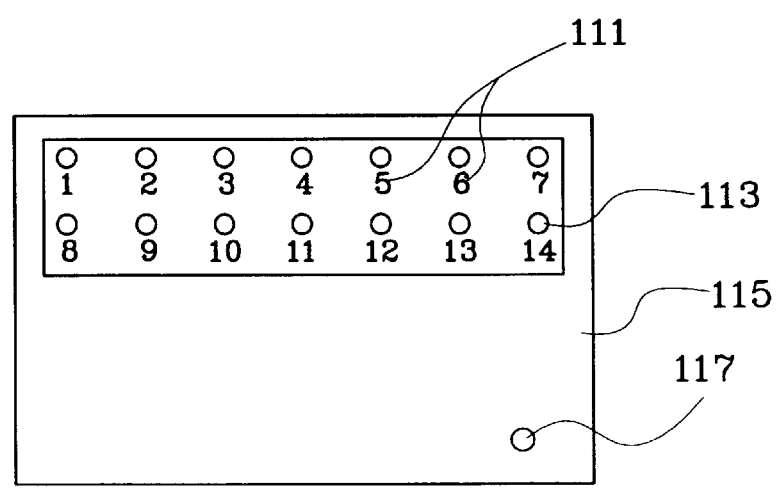
FIGS. 11 and 12 are views showing an example of a panel for indicating the location of a defective fuse in an audio-visual manner.
Figure 12:
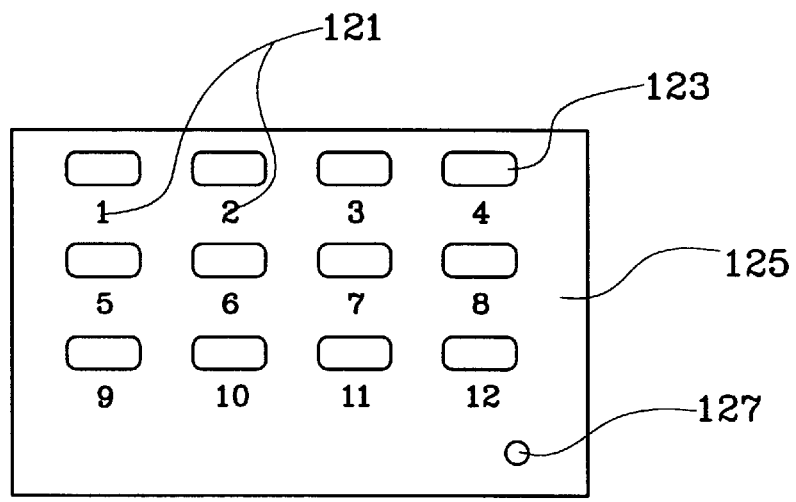

FIGS. 11 and 12 show examples of a panel for indicating the location of a defective fuse in an audio-visual manner. FIG. 11 shows a panel installed around a fuse box or at a position for a driver to easily check whether a fuse or relay is out of order, and having an LED lamp 113 corresponding to a number 111 of the fuse or relay and a speaker 117 for outputting corresponding voice signals so that the result of diagnosis of operational failure in automobiles is noted in an audio-visual manner. FIG. 12 shows another panel installed around a fuse box or at a position for a driver to easily check whether a fuse or relay is out of order, and having a semitransparent window 123, formed at the position corresponding to a number 121 of the fuse or relay, for transmitting light from an LED lamp (not shown) and a speaker 127 for outputting corresponding voice signals so that the result of diagnosis of operational failure in automobiles is noted in an audio-visual manner. Here, an additional speaker may be used as the speakers 117 and 127, or the speakers of the car audio system may be used therefor.

Figure 13:
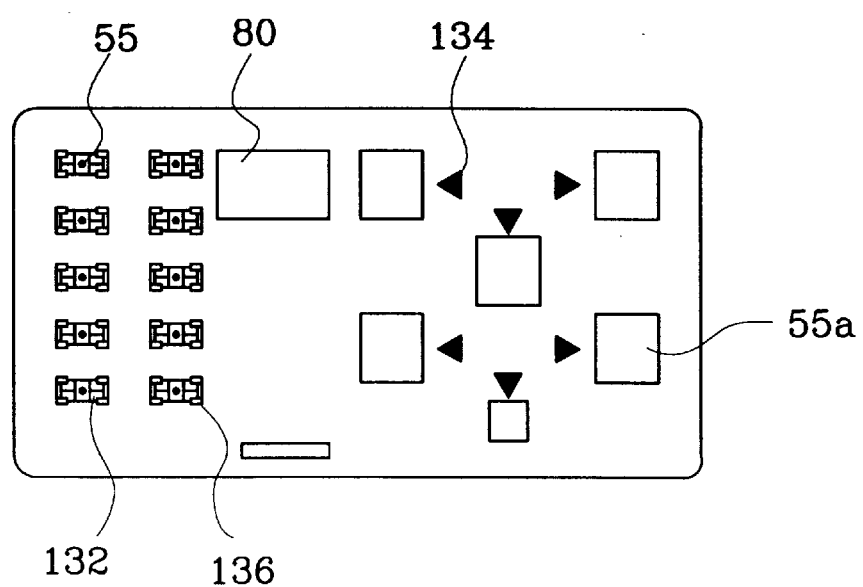
FIG. 13 is a view showing an example of a panel for indicating the location of a defective fuse or a relay in an audio-visual manner.

FIG. 13 shows an example of a panel for indicating the location of a defective fuse or relay in an audio-visual manner. FIG. 13 shows a panel installed around a fuse box or at a position for a driver to easily check whether the fuses 55 or the relay 55a is out of order, and having an LED lamp 132 under a fuse connector 136 to light and another LED lamp 134 around the relay 55a to indicate operational failure of the fuse or relay by lighting the LED lamps 132 and 134, and also having a display portion 80 for displaying text so that the result of diagnosis of operational failure in automobiles is noted in an audio-visual manner.

Here, the LED lamp is applied to the present invention lights when the fuse or relay is defective so that it is easy to locate the position of defective fuse or relay. If a cover of the fuse box is formed to be transparent, the light from the LED lamp transmitting the transparent portion of a fuse illuminates the fuse box so that to locate the position of defective fuse or relay is easier.

Figure 14:
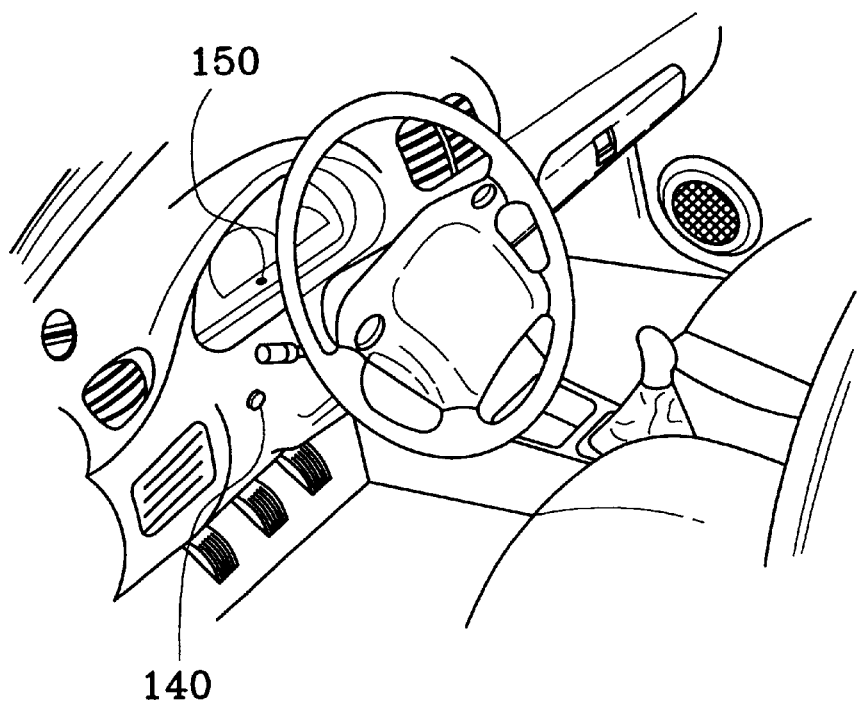
FIG. 14 is a view for explaining that the apparatus for diagnosing and indicating operational failure in automobiles according to the present invention can be easily installed.

FIG. 14 is a view for explaining that a driver operates the apparatus for diagnosing and indicating operational failure in automobiles according to the present invention in an automobile. A speaker included operation switch 140 is placed near a dash board 150 of an automobile to facilitate operation of the apparatus for diagnosing and indicating operational failure in automobiles according to the present invention in an automobile. Although the apparatus for diagnosing and indicating operational failure in automobiles according to the present invention in an automobile can be operated by manipulating the speaker included operation switch 140 by the driver, the speaker included operation switch 140 may be used as a switch for controlling voice output of the result of diagnosis of operational failure in automobiles. That is, the speaker included operation switch 140 can be used to indicate the result of diagnosis of operational failure in automobiles, by voice, only when the operation switch 140 is turned on.

Figure 15:
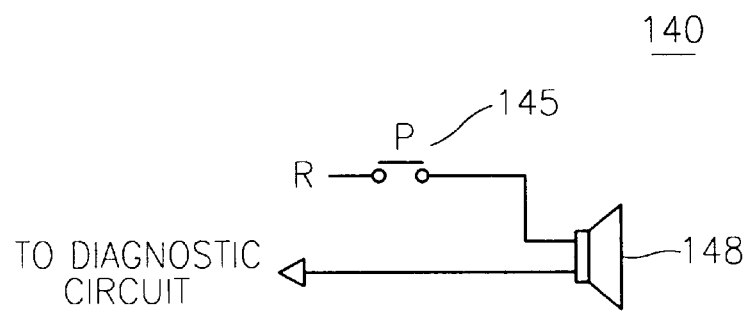
FIG. 15 is a view for explaining an operation switch of FIG. 14.

FIG. 15 is a view for explaining the speaker included operation switch of FIG. 14, for which a speaker included switch or a push button switch can be used. In FIG. 15, a speaker 148 is operated only when the operation switch 145 is pressed.

Figure 16:
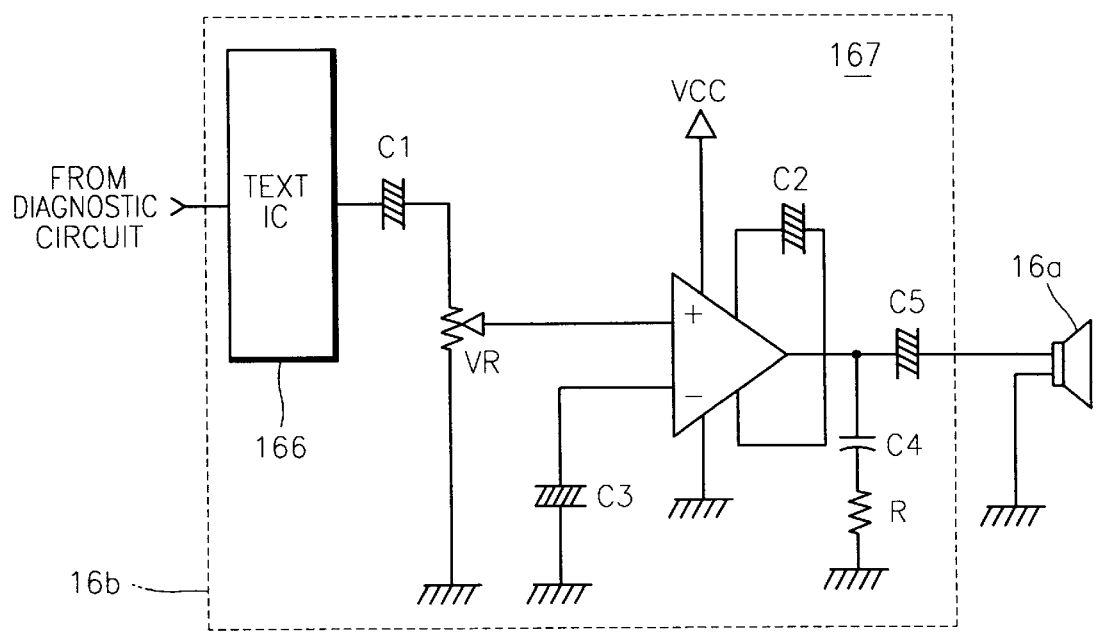
FIG. 16 is a circuit diagram showing a sound generating portion of the output devices of the apparatus for diagnosing and indicating operational failure in automobiles according to the present invention.

FIG. 16 is a view for explaining a voice generating portion of the output devices of the apparatus for diagnosing and indicating operational failure in automobiles according to the present invention. A voice generating portion 16b includes a voice IC 166 for receiving signals from the diagnostic circuit 20 and outputting stored voice signals according to a software program, and an amplification portion 167 for amplifying and outputting the voice signals output from the voice IC 166. The voice generating portion 16b may be arranged in the diagnostic circuit 20 or outside the diagnostic circuit 20 with a speaker 16A. The voice IC 166 generally stores voice in a built-in memory and outputs voice signals corresponding to the result of diagnosis under the control of an included controller. The speaker 16a can be appropriately installed on the dash board 150 or inside an automobile so that a driver can easily hear the voice in the automobile. The output voice is a guidance for indicating the location of operational failure of the fuse or relay to inform the driver of the state of operational failure aurally so that defective electric parts in the automobile can be easily repaired in order. In FIG. 16, VR and R denote a variable resistor and a resistor, respectively, and $C_1$ through $C_5$ denote capacitors. A detailed description thereof will be omitted as it is obvious for one skilled in the art.

Figure 17:
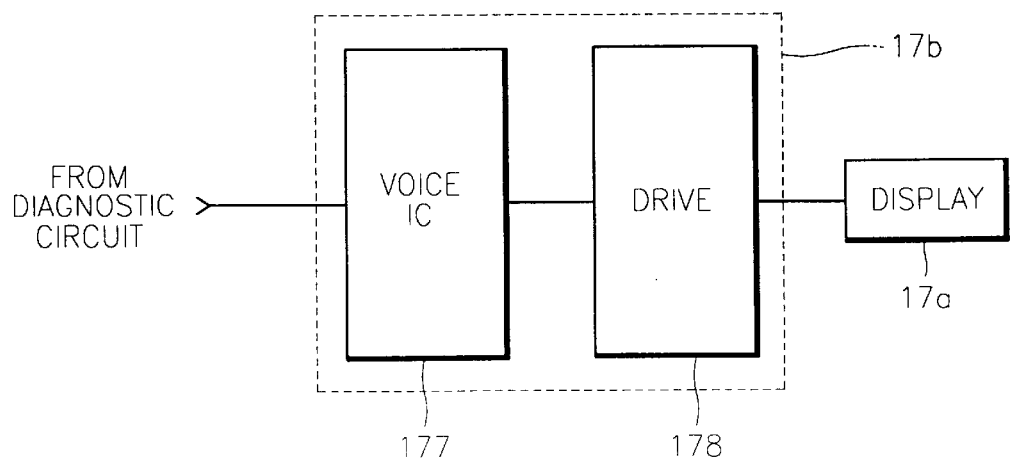
FIG. 17 is a circuit diagram showing a text generating circuit of the output devices of the apparatus for diagnosing and indicating operational failure in automobiles according to the present invention.

FIG. 17 is a view for explaining a text generating portion of the output devices of the apparatus for diagnosing and indicating operational failure in automobiles according to the present invention. A text generating portion 17b includes a text IC 177 for receiving signals from the diagnostic circuit 20 and outputting stored text signals according to a software program, and a driving portion 178 for driving the text signals output from the IC 177 and outputting the driven text signals to an external display 17a. The text generating portion 17b may be arranged in the diagnostic circuit 20 or outside the diagnostic circuit 20 with the display 17a. The text IC 177 generally stores text in a built-in memory and outputs text signals corresponding to the result of diagnosis under the control of an included controller. The display 17a can be appropriately installed on the dash board 150 or inside an automobile so that a driver can easily recognize the text in the automobile. The output text or image is a guidance for indicating the location of operational failure of the fuse or relay to inform the driver of the state of operational failure visually so that defective electric parts in the automobile can be easily repaired in order. A detailed description thereof will be omitted as it is obvious for one skilled in the art.

Figure 18:
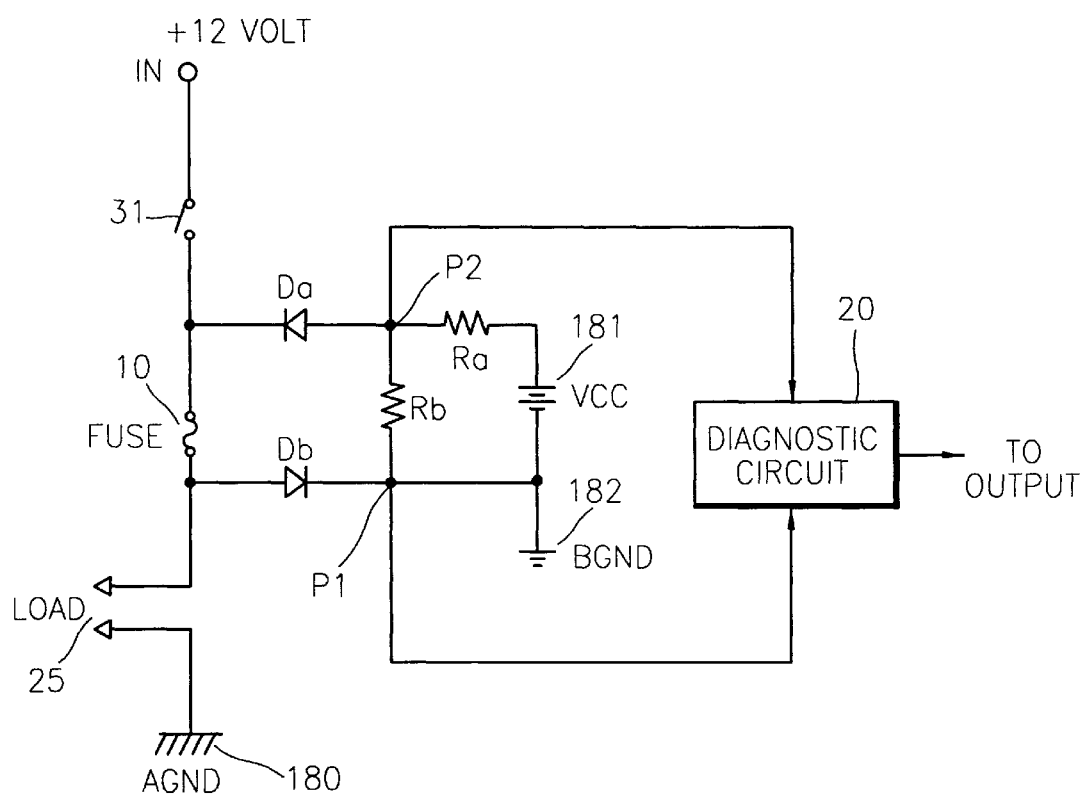
FIG. 18 is a power circuit diagram in which an additional independent power source is connected to the fuse so that the diagnostic circuit of the present invention can operate in a state in which an automobile is not started.

FIG. 18 is a power circuit diagram in which an additional independent power source is connected to the fuse so that the diagnostic circuit of the present invention can operate in a state in which an automobile is not started. In FIG. 18, an additional power circuit is connected so that the diagnostic circuit 20 of the present invention operate even when the power switch 31 installed at a pressing end of the fuse 10 is turned off. The power circuit is provided with an independent power VCC 181 and an independent ground BGND 182. The ground 182 performs a floating ground role separately from the existing ground AGND 180 to prevent reverse current by diodes Da and Db without affecting the existing power source and diagnose changes in voltage at both ends of the fuse. The diagnostic circuit 20 is connected to points P1 and P2. Thus, even if a voltage is not applied to the fuse 10 from the main power +12 V, the diagnostic circuit 20 is operated. When the automobile is not started, slight current flows the fuse 10 due to the independent fuse power supply circuit. As the current is very low, resistors Ra and Rb are designed to disregard the current. Thus, when the automobile is not started and the fuse 10 is disconnected, the diagnostic circuit 10 can recognize that the fuse 10 is disconnected.

In the description above, the apparatus for diagnosing and indicating operational failure in automobiles according to the present invention can be manufactured not only in a built-in type but also a cartridge type or external box type so that it may be easily applied to nearly all types of automobiles. For an external type, the present apparatus can be installed without making significant modifications to the existing fuse box. Although the present invention is described above as an application for automobiles, the present invention may be variously applied to an electric wiring for industrial use or in an atomic reactor, underground equipments or narrow ducts that is difficult to access, for maintenance thereof.

As described above, according to the apparatus for diagnosing and indicating operational failure in automobiles according to the present invention, a driver having little knowledge on car maintenance can easily take actions for repair or an emergency measure of automobiles according to the result of diagnosis of operational failure of the automobile informed in an audio-visual manner. Also, automobile repair experts or shops can save time and cost needed for diagnosing and performing accurate repair using the apparatus for diagnosing and indicating operational failure in automobiles according to the present invention.

What is claimed is:

1. An apparatus for diagnosing and indicating operational failure in automobiles, the apparatus comprising:

a diagnostic circuit receiving signals input through wiring at both ends of each fuse and wiring of a relay in a fuse box or junction box installed in an automobile and diagnosing operation failure by detecting a change in the logic value of the input signals; and an output device for receiving the result of diagnosis from the diagnostic circuit and outputting signals indicating the location of a defective fuse or relay.

2. The apparatus as claimed in claim 1, wherein the diagnostic circuit comprises a logic element for checking the change in electric potential at both ends of the fuse or relay and outputting a logic value and a gating element gated according to the logic value.

3. The apparatus as claimed in claim 2, wherein the logic element is a comparator for checking the change in voltages at both ends of the fuse or relay, including an exclusive NOR (EX-NOR) gate, a transistor element or a photocoupler.

4. The apparatus as claimed in claim 1, wherein an additional independent power circuit is connected to both ends of the fuse of relay to apply a voltage to the fuse.

5. The apparatus as claimed in claim 1, wherein, when the diagnostic circuit is a built-in type, the diagnostic circuit is arranged at space allowed on a single printed circuit board and connected to an external output device through a cable wire.

6. The apparatus as claimed in claim 1, wherein, when the diagnostic circuit is an external type, the diagnostic circuit is arranged on a single printed circuit board to be installed in an external box and is connected to the fuse box through a cable wire and to an internal or the external output device.

7. The apparatus as claimed in claim 6, wherein a fuse connector connected to the fuse is of a hermaphroditic body so that a female connector portion is connected to the fuse and a male connector portion is connected to the diagnostic circuit and also to a connector in a fuse insertion hole of the fuse box.

8. The apparatus as claimed in claim 6, wherein a relay connector connected to the relay is of a hermaphroditic body so that a female connector portion is connected to the relay and a male connector portion is connected to the diagnostic circuit and also to a connector in a relay insertion hole of the relay box.

9. The apparatus as claimed in claim 1, wherein, when the diagnostic circuit is an external type, the diagnostic circuit is arranged on a single printed circuit board, and a connector pin protruding from the board is formed of a cartridge type to be inserted in a contact point hole of each fuse in the fuse box.

10. The apparatus as claimed in claim 1, wherein the diagnostic circuit and the output device are formed on a single printed circuit board or different printed circuit boards.

11. The apparatus as claimed in claim 1, wherein the output device comprises a lamp circuit and lamp for indicating the location of a defective fuse or relay according to the result of diagnosis by the diagnostic circuit.

12. The apparatus as claimed in claim 1, wherein the output device comprises a voice guide module and a speaker for indicating by voice the location of a defective fuse or relay according to the result of diagnosis by the diagnostic circuit.

13. The apparatus as claimed in claim 1, wherein the output device comprises a text generating portion and a display for indicating the location of a defective fuse or relay according to the result of diagnosis by the diagnostic circuit.

14. The apparatus as claimed in claim 1, wherein the output device comprises a lamp circuit and lamp for indicating the location of a defective fuse or relay according to the result of diagnosis by the diagnostic circuit and a voice guide module and a speaker for indicating by voice the location of a defective fuse or relay according to result of diagnosis by the diagnostic circuit.

15. The apparatus as claimed in claim 1, wherein the output device comprises a lamp circuit and lamp for indicating the location of a defective fuse or relay according to the result of diagnosis by the diagnostic circuit, a voice guide module and a speaker for indicating by voice the location of a defective fuse or relay according to the result of diagnosis by the diagnostic circuit, and a text generating portion and a display for indicating the location of a defective fuse or relay according to the result of diagnosis by the diagnostic circuit.

16. The apparatus as claimed in claim 1, wherein the output device comprises a lamp circuit and lamp for indicating the location of a defective fuse or relay according to the result of diagnosis by the diagnostic circuit and a text generating portion and a display for indicating the location of a defective fuse or relay according to the result of diagnosis by the diagnostic circuit.

* * * * *